United States Patent [19]

Hillebrand

[11] Patent Number: 4,862,091

[45] Date of Patent: Aug. 29, 1989

[54] CIRCUIT ARRANGEMENT FOR TESTING THE CONNECTING LINES OF A SWITCH OR SENSOR

[75] Inventor: Helmut Hillebrand, Munich, Fed. Rep. of Germany

[73] Assignee: Bayerische Motoren Werke AG, Munich, Fed. Rep. of Germany

[21] Appl. No.: 221,742

[22] Filed: Jul. 20, 1988

[30] Foreign Application Priority Data

Jul. 28, 1987 [DE] Fed. Rep. of Germany ....... 3724926

[51] Int. Cl.⁴ .......................... G01R 31/02; B60Q 1/44
[52] U.S. Cl. .................................... 324/415; 280/735; 340/644; 340/436
[58] Field of Search ............... 324/415, 537, 421, 550; 340/644, 52 H, 638; 280/735

[56] References Cited

U.S. PATENT DOCUMENTS 4,695,075 9/1987 Kamiji et al. ..................... 280/735

FOREIGN PATENT DOCUMENTS 0032694 1/1981 European Pat. Off. .
0163845 4/1985 European Pat. Off. .
97754 4/1972 Fed. Rep. of Germany .

OTHER PUBLICATIONS

Luigi Brambilla, "Airbag and Belt Pretensioner Provide Increased Safety for Driver and Front Passenger", pp. 77-84, ATZ Automobiltechnishe Zeitschrift.

Primary Examiner—Reinhard J. Eisenzopf
Assistant Examiner—Anthony L. Miele
Attorney, Agent, or Firm—Barnes & Thornburg

[57] ABSTRACT

A circuit arrangement is disclosed for monitoring the connecting lines of a switch or sensor open in the normal condition, with a first ohmic resistance connected in series with the switch or sensor. That together with the switch or sensor and a second ohmic resistance connected in parallel to both forms a parallel circuit, whose first connecting line is connected to ground and whose second connecting line is connected, on the one hand, to a voltage supply by way of a third ohmic resistance and, on the other, with a voltage discriminator unit. The second ohmic resistance is adapted to be disconnected.

3 Claims, 1 Drawing Sheet

CIRCUIT ARRANGEMENT FOR TESTING THE CONNECTING LINES OF A SWITCH OR SENSOR

BACKGROUND AND SUMMARY OF THE INVENTION

The present invention relates to a circuit arrangement for monitoring or testing the connecting lines of a switch or sensor open in the normal condition, with a first resistance connected in series with the same which, together with the switch or sensor and a second resistance connected in parallel to both, forms a parallel circuit, whose first connecting line is connected to ground and whose second connecting line is connected, on the one hand, by way of a third resistance to a voltage supply and, on the other hand, with a voltage discriminator unit.

Such a circuit arrangement is used already for monitoring or testing the functioning of the connecting lines to a sensor of an air bag control apparatus of a motor vehicle. As in this known circuit arrangement, the output voltage of the volage supply has been selected smaller than the battery voltage of the motor vehicle, the connecting line of the sensor connected to the voltage supply can be tested or monitored as regards a short circuit to ground, a short circuit to the battery voltage as well as a line interruption. Furthermore, the connecting line of the sensor connected with the ground potential can be monitored with respect to a short circuit to the battery voltage as well as a line interruption. These monitoring or testing possibilities of the connecting lines of the sensor can be traced back to the fact that a defined voltage level exists at the voltage discriminator unit both in the two shifting conditions of the sensor with intact connecting lines as also with defective connecting lines corresponding to the respective line defect. Thus, with intact connecting lines and with an open sensor, a voltage exists at the voltage discriminator unit which is determined by the voltage divider formed by the second and third ohmic resistance. Furthermore, with a closed sensor, a voltage exists at the voltage discriminator unit which is determined by the voltage divider formed by the first, second and third ohmic resistance. Of these two voltages which occur at the voltage discriminator unit with intact connecting lines to the sensor, the voltages differ which occur at the voltage discriminator unit in case of the aforementioned defects. Thus, for example, with a short circuit of the connecting line of the sensor connected to the voltage supply with respect to the battery voltage, the battery voltage exists at the voltage discriminator unit whereas in case of a short circuit with respect to ground potential, the ground potential exists at the voltage discriminator unit and in case of a line interruption, the output voltage of the voltage supply exists at the voltage discriminator unit.

This known circuit arrangement only entails the disadvantage that with an operationally ready sensor, a diagnostic current always flows also in the open position thereof by way of the second and third ohmic resistance. This has as a consequence that the known circuit arrangement can be used in the motor vehicle industry only with such sensors, respectively, switches which are not connected to the voltage with a turned-off ignition switch because otherwise the battery will be discharged during the standstill of the motor vehicle, as a result of which after a longer standstill period of the motor vehicle the latter can no longer be started. It is therefore the obect of the present invention to so further develop a circuit arrangement of the aforementioned type that it can also be utilized for monitoring the connecting lines of switches or sensors which remain connected to voltage also with a turned-off ignition switch.

The underlying problems are solved according to the present invention in that the second ohmic resistance is adapted to be diconnected.

As the second ohmic resistance is not necessary for the functioning ability of the switch or of the sensor, but is required only in order to be able to monitor or test with an open switch or sensor the connecting line thereof connected to the voltage supply as regards a line interruption, it can be disconnected for reasons of current economy during a predetermined time period, for example, during the standstill of a motor vehicle, during which a monitoring or testing of the connecting lines of the switch or of the sensor is not required.

This takes place advantageously according to a further feature of the present invention in that a Zener diode is provided in the current branch containing the second ohmic resistance of the parallel circuit formed by the first and second ohmic resistance as well as by the switch or sensor, and in that the voltage supply is adapted to be switched from a greater to a smaller output voltage in comparison to the breakdown voltage of the Zener diode. With the use of such a circuit arrangement in a motor vehicle, the voltage supply is preferably so switched that it produces an output voltage during the driving operation of the motor vehicle which is larger than the breakdown voltage of the Zener diode with the consequence that the Zener diode is rendered conducting in the blocking direction. In this condition, a diagnostic current can flow by way of the second or third ohmic resistance with an open switch or sensor which is required for the determination of a line interruption of the current-conducting line of the switch or sensor. For disconnecting the second ohmic resistance during the motor vehicle standstill, the voltage supply is switched to an output voltage which is smaller than the breakdown voltage of the Zener diode. As a result of this measure, the Zener diode is switched to be non-conducting in the blocking direction, with the consequence that no diagnostic current can flow any longer through the current branch containing the second resistance. It is achieved thereby that the circuit arrangement according to the present invention represents no current load during the motor vehicle standstill with the exception of the negligible leakage current of the Zener diode.

In a second, alternative possibility for disconnecting the second ohmic resistance, an electronic switch is provided in the current branch containing the second ohmic resistance. With the use of this circuit arrangement in the motor vehicle, the control input of the electronic switch is preferably so connected to the ignition circuit of the motor vehicle that the electronic switch is switched to be conductive when the ignition switch is closed and is rendered non-conductive when the ignition switch is opened. It is achieved thereby that only with a closed ignition switch, i.e., as a rule in the driving operation of the motor vehicle, when the generator or alternator of the motor vehicle continuously recharges the battery, a diagnostic current can flow through the second ohmic resistance which is required exclusively for the monitoring or testing of the connecting lines of the switch or of the sensor but is not required for the functioning of the switch or sensor. Owing to the fact that with an open ignition switch, no diagnostic current can flow through the second ohmic resistance not required for the functioning of the switch or sensor, a discharge of the battery during a motor vehicle standstill is avoided.

BRIEF DESCRIPTION OF THE DRAWINGS

These and other objects, features and advantages of the present invention will become more apparent from the following description when taken in connection with the accompanying drawing which shows, for purposes of illustration only, two embodiments in accordance with the present invention, and wherein.

DETAILED DESCRIPTION OF THE DRAWINGS

Figure 1:
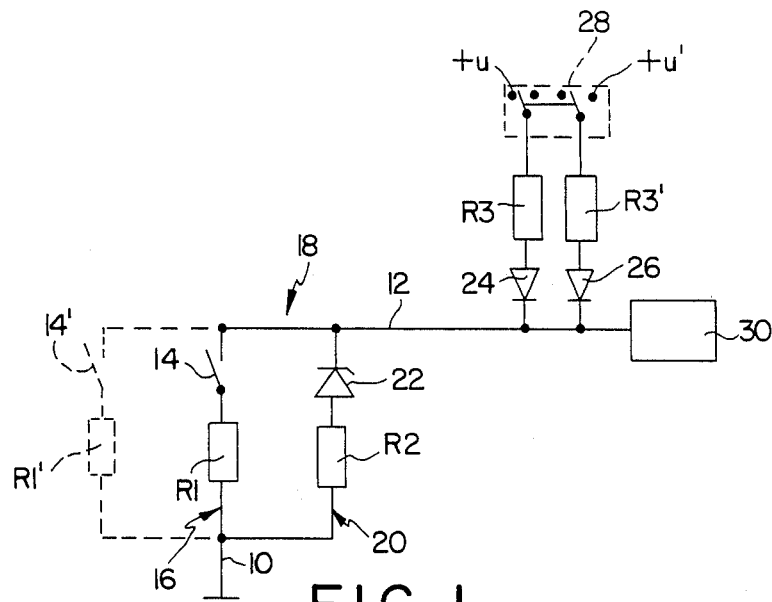
FIG. 1 is a schematic cicuit diagram of a first embodiment of the present invention.

Referring now to the drawing wherein like reference numerals are used throughout the two views to designate like parts, the circuit arrangement for monitoring or testing the connecting lines 10 and 12 of a switch 14 open in the normal or de-energized condition, which is illustrated in FIG. 1, includes a first ohmic resistance R1 connected in series therewith. The switch 14 and the ohmic resistance R1 thereby form a first current branch 16 of a parallel circuit generally designated by reference numeral 18, in the second current branch 20 of which is connected a second ohmic resistance R2 and a Zener diode 22. The second connecting line 12 of the switch 14 and therewith also of the parallel circuit 18 is connected, on the one hand, by way of a first decoupling diode 24 and a third resistance R3 as well as by way of a second decoupling diode 26 and an ohmic resistance R3' to a voltage supply 28 adapted to be switched as regards its output voltage from a +U to +U' and vice versa and, on the other, with a voltage discriminator unit 30. By contrast, the first connecting line 10 of the switch 14 and therewith of the parallel circuit 18 is connected to ground potential. In addition to the switch 14, still further switches connected in parallel with the switch 14 can also be connected with the connecting lines 10 and 12. In FIG. 1, such a further switch 14' together with a further first ohmic resistance R1' connected in series therewith is indicated in dash lines.

With the foregoing description of the circuitry of the circuit arrangement illustrated in FIG. 1, the functioning of this circuit arrangement will now be explained as follows.

It can be tested or monitored with the circuit arrangement illustrated in FIG. 1 whether the connecting lines 10 and 12 of the switch 14 open in the normal or de-energized condition are intact. In order to be able to determine with the use of this circuit arrangement in a motor vehicle also a short-circuit of the connecting lines 10 and 12 of the switch 14 with respect to the battery voltage of the motor vehicle, it is necessary that the voltage supply 28 produces an output voltage +U which is smaller than the battery voltage and greater than the breakdown voltage of the Zener diode 22. In this case, on the one hand, the respective switching condition of the switch 14 can be reliably recognized by the voltage discriminator unit 30 and, on the other, it can be determined whether in the lines 10 and 12 a short circuit with respect to ground exists, a short circuit with respect to the battery voltage exists or a line interruption exists. If, for example, a short circuit with respect to the battery voltage exists in the line 12, then the battery voltage exists at the input of the voltage discriminator 30. If, by contrast, a short circuit with respect to ground potential exists, then the ground potential is present at the input of the voltage discriminator unit 30. If finally the connecting line 12 is interrupted, i.e. is open, then the voltage +U produced by the voltage supply device 28 is present at the input of the voltage discriminator unit 30. These defect conditions can be reliably recognized by the voltage discriminator unit 30 because the aforementioned voltage values can occur at the input of the voltage discriminator unit 30 only with a defective connecting line 12. Thus, a voltage appears at the input of the voltage discriminator unit 30 with intact connecting lines 10 and 12 and with an open switch 14 which is determined by the voltage +U of the voltage supply 28 and by the voltage divider formed by the ohmic resistances R2 and R3 and the Zener diode. With intact feed lines 10 and 12 and with a closed switch 14, a voltage will appear at the input of the voltage discriminator unit 30 which is determined by the voltage +U of the voltage supply 28 and the voltage divider formed by the parallel circuit 18 and the resistance R3. The switching conditions of the switch 14 with intact feed lines 10 and 12 are also the different defect conditions of the feed lines 10 and 12 to the switch 14 can thus be unequivocally recognized by the voltage discriminator unit 30. However, the ohmic resistance R2 connected in parallel with the switch 14 and with the ohmic resistance R1 is thereby required only in order that the voltage discriminator unit 30 can determine a line interruption of the connecting line 12 with an open switch 14. Whereas for the case that the ohmic resistance R2 is not present, respectively, disconnected, the output voltage of the voltage supply 28 is present at the input of the voltage discriminator unit 30 with an open switch 14 as well as with an interruption of the connecting line 12, a voltage will be present at the input of the voltage discriminator unit 30 with the ohmic resistance R2 connected in parallel with the open switch 14, which is determined by the output voltage of the voltage power supply 28 and by the voltage divider formed by the ohmic resistances R2 and R3 and the Zener diode. As this voltage differs from the output voltage of the voltage supply, an open line 12 of the switch 14 can be reliably determined.

The parallel circuit of the ohmic resistance R2 with respect to switch 14, however, entails the disadvantage that also with an open switch 14, a diagnostic current flows continuously through the ohmic resistances R2 and R3 which has as a consequence a relatively high current consumption. In order to reduce this current consumption, the resistance R2 is disconnected or opened up in accordance with the present invention, without impairing thereby the functioning ability of the switch 14, during the periods of time during which a testing or monitoring of the connecting lines 10 and 12 to the switch 14 by the voltage discriminator unit 30 is not required. With the use of such a circuit arrangement in a motor vehicle, one will disconnect the resistance R2 preferably with an opened ignition circuit, i.e., during the standstill of the motor vehicle, in order not to drain unnecessarily the battery of the motor vehicle and therewith to assure a starting of the motor vehicle also after a longer standstill of the motor vehicle. The disconnection of the resistance R2 takes place in the circuit arrangement illustrated in FIG. 1 in that the voltage supply 28 is switched from the output voltage +U to the output voltage +U' which is smaller than the breakdown voltage of the Zener diode 22, as a reslt of which the latter is rendered non-conductive.

Figure 2:
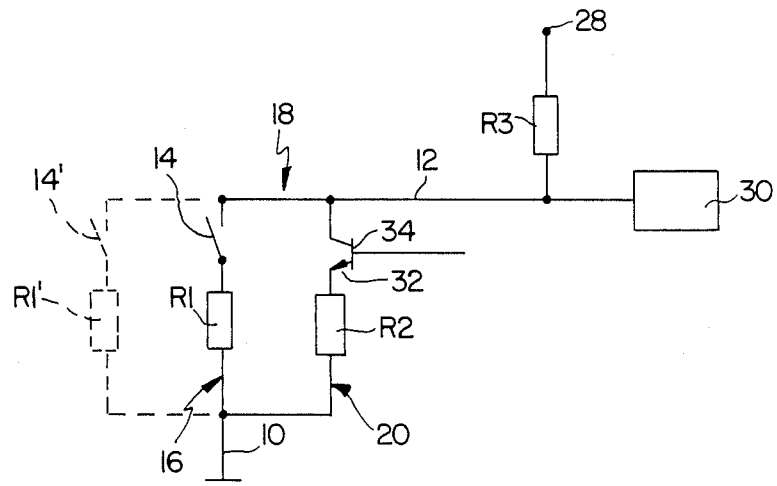
FIG. 2 is a schematic circuit diagram of a second embodiment in accordance with the present invention.

The circuit arrangement illustrated in FIG. 2 differs from the circuit arrangement illustrated in FIG. 1 only by a different type of the disconnection of the Ohmic resistance R2. In the circuit arrangement illustrated in FIG. 2 whose parts corresponding with the circuit arrangement of FIG. 1 are designated with the corresponding reference numerals of the circuit arrangement of FIG. 1, a transistor 32 is provided as electronic switch for the disconnection of the ohmic resistance R2 in the current branch 20 of the parallel circuit 18 which contains this resistance; the current branch 20 can be interrupted or opened up by the transistor 32. With the use of this circuit arrangement in a motor vehicle, the control electrode (base) 34 of the transistor 32 is preferably connected with the ignition circuit of the motor vehicle. It is achieved in this manner that only with a closed ignition circuit a diagnostic current flows through the current circuit 20 of the parallel circuit 18 whereas with an open ignition circuit the current branch 20 of the parallel circuit 18 is interrupted or opened up by the transistor 32 which is then switched to be non-conductive.

By reason of the disconnectability of the ohmic resistance R2 required only for diagnostic purposes, the circuit arrangement in accordance with the present invention can also be utilized in the motor vehicle industry for monitoring the connecting lines of switches or sensors which are not connected to the voltage supply only by the closing of the ignition switch, but which are connected continuously to the voltage supply in order to be operational also with an open ignition switch.

While I have shown and described only two embodiments in accordance with the present invention, it is understood that the same is not limited thereto but is susceptible of numerous changes and modifications as known to skilled in the art, and I therefore do not wish to be limited to the details shown and described herein but intend to cover all such changes and modifications as are encompassed by the scope of the appended claims.

I claim:

1. A circuit arrangement for monitoring the connecting lines of a switchable device open in the normal condition, comprising:
    a first resistance means connected in series with said device;
    a second resistance means connected in parallel with the first resistance means and the device to form a parallel circuit;
    a first connecting line connecting said parallel circuit with ground potential;
    a second connecting line connecting said parallel circuit to a voltage supply means by way of a third resistance means and to a voltage discriminator means;
    a Zener diode in series with the second resistance and operable to disconnect the second resistance means; and
    said voltage supply means including a first output voltage larger then the breakdown voltage of the Zener diode and a second output voltage smaller than the breakdown voltage of the Zener diode, and means for selecting the first or second output voltage.

2. A circuit arrangement according to claim 7, wherein said resistance means are ohmic resistances.

3. A circuit arrangement according to claim 7, wherein said device is one of switch or sensor.

* * * * *